United States Patent
Chen et al.

(10) Patent No.: US 11,239,135 B2
(45) Date of Patent: Feb. 1, 2022

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Shih-Wei Chen, Hsinchu (TW); Hao-Yi Tsai, Hsinchu (TW); Kuo-Lung Pan, Hsinchu (TW); Tin-Hao Kuo, Hsinchu (TW); Po-Yuan Teng, Hsinchu (TW); Chi-Hui Lai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/515,024

(22) Filed: Jul. 18, 2019

(65) Prior Publication Data

US 2021/0020538 A1 Jan. 21, 2021

(51) Int. Cl.
*H01L 23/367* (2006.01)
*H01L 21/48* (2006.01)
*H01L 21/3205* (2006.01)
*H01L 25/065* (2006.01)
*H01L 23/373* (2006.01)
*H01L 23/552* (2006.01)
*H01L 23/00* (2006.01)
*H01L 25/18* (2006.01)
*H01L 23/498* (2006.01)

(52) U.S. Cl.
CPC .... *H01L 23/3677* (2013.01); *H01L 21/32051* (2013.01); *H01L 21/4882* (2013.01); *H01L 23/3736* (2013.01); *H01L 23/552* (2013.01); *H01L 25/0655* (2013.01); *H01L 23/49827* (2013.01); *H01L 23/49833* (2013.01); *H01L 24/24* (2013.01); *H01L 25/18* (2013.01); *H01L 2224/24137* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Steven B Gauthier
(74) *Attorney, Agent, or Firm* — JCIPRNET

(57) ABSTRACT

A package structure includes a semiconductor die, a redistribution circuit structure, and a metallization element. The semiconductor die has an active side and an opposite side opposite to the active side. The redistribution circuit structure is disposed on the active side and is electrically coupled to the semiconductor die. The metallization element has a plate portion and a branch portion connecting to the plate portion, wherein the metallization element is electrically isolated to the semiconductor die, and the plate portion of the metallization element is in contact with the opposite side.

16 Claims, 16 Drawing Sheets

(56) References Cited

U.S. PATENT DOCUMENTS

| | | |
|---|---|---|
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2012/0056329 A1* | 3/2012 | Pagaila ................ H01L 21/486 257/774 |
| 2018/0151472 A1* | 5/2018 | Chen ................... H01L 23/3736 |

* cited by examiner

PACKAGE STRUCTURE AND METHOD OF MANUFACTURING THE SAME

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
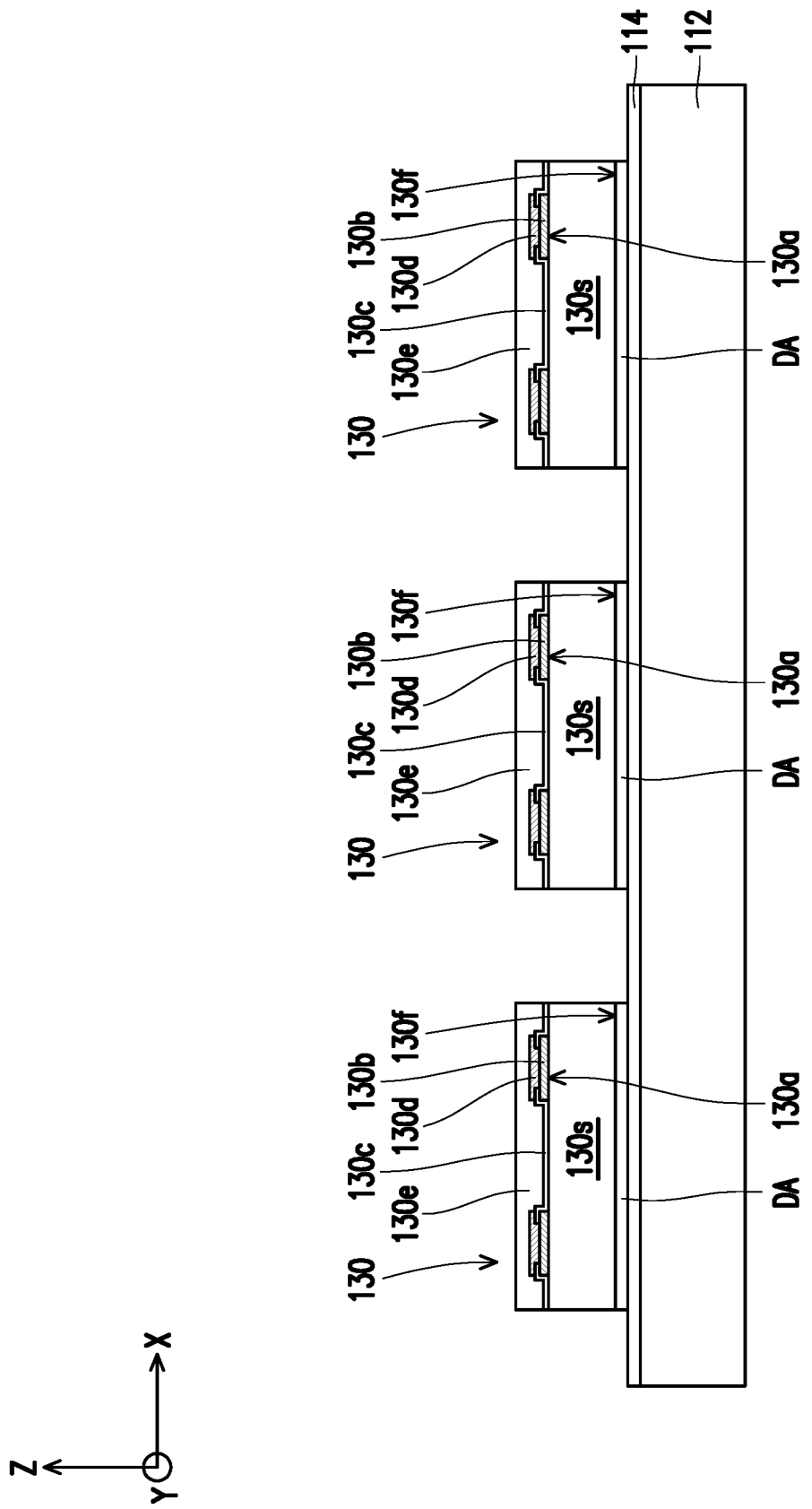
FIG. 1 to FIG. 11 are schematic cross-sectional views of various stages in a manufacturing method of a package in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 16:
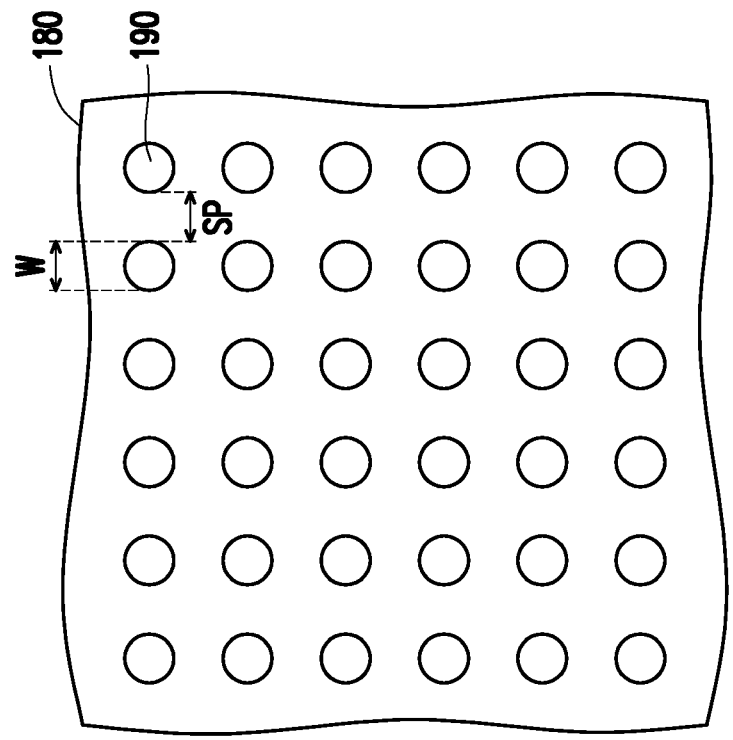
FIG. 16 is a schematic, partially and enlarged plane view illustrating a heat dissipating element of a package in accordance with some embodiments of the disclosure.

FIG. 1 to FIG. 11 are schematic cross-sectional views of various stages in a manufacturing method of a package in accordance with some embodiments of the disclosure. FIG. 16 is a schematic, partially and enlarged plane view illustrating a heat dissipating element of a package in accordance with some embodiments of the disclosure. In embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 11, more than one (semiconductor) chips or dies are shown to represent plural (semiconductor) chips or dies of the wafer, and a package are shown to represent a package structure obtained following the manufacturing method, for example. In other embodiments, one or more than one (semiconductor) chips or dies are shown to represent plural (semiconductor) chips or dies of the wafer, and one or more than one packages are shown to represent plural (semiconductor) package structures obtained following the (semiconductor) manufacturing method, the disclosure is not limited thereto.

Referring to FIG. 1, in some embodiments, a carrier 112 is provided. In some embodiments, the carrier 112 may be a glass carrier or any suitable carrier for carrying a semiconductor wafer or a reconstituted wafer for the manufacturing method of the semiconductor package. In some embodiments, the carrier 112 is coated with a debond layer 114. The material of the debond layer 114 may be any material suitable for bonding and debonding the carrier 112 from the above layer(s) or any wafer(s) disposed thereon.

In some embodiments, the debond layer 114 may include a dielectric material layer made of a dielectric material including any suitable polymer-based dielectric material (such as benzocyclobutene (BCB), polybenzoxazole (PBO)). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights. In certain embodiments, the debond layer 114 may be dispensed as a liquid and cured, or may be a laminate film laminated onto the carrier 112, or may be the like. The top surface of the debond layer 114, which is opposite to a bottom surface contacting the carrier 112, may be levelled and may have a high degree of coplanarity. In certain embodiments, the debond layer 114 is, for example, a LTHC layer with good chemical resistance, and such layer enables room temperature debonding from the carrier 112 by applying laser irradiation, however the disclosure is not limited thereto.

In an alternative embodiment, a buffer layer (not shown) may be coated on the debond layer 114, where the debond layer 114 is sandwiched between the buffer layer and the carrier 112, and the top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Continued on FIG. 1, in some embodiments, at least one semiconductor die 130 with a connecting film DA disposed thereon is provided over the carrier 112. Hereafter, three semiconductor dies 130 are shown in FIG. 1 for illustration purpose; however, the disclosure is not limited thereto. In other embodiments, the number of the semiconductor dies 130 may be one or more than one based on the demand and the design layout. In some embodiments, the semiconductor dies 130 are arranged next to each other along a X-Y plane.

In some embodiments, as shown in FIG. 1, the semiconductor dies 130 are disposed over the carrier 112 and on the debond layer 114 through the connecting films DA, respectively. In some embodiments, each of the connecting films DA is located between a respective one of the semiconductor dies 130 and the debond layer 114, and each of the connecting films DA physically contacts a backside surface 130$f$ of the respective one of the semiconductor dies 130 and the debond layer 114. In some embodiments, due to the connecting films DA provided between the semiconductor dies 130 the debond layer 114, the semiconductor dies 130 and the debond layer 114 are stably adhered to each other for ensuring the positioning location of the semiconductor dies 130 during the manufacturing process. In some embodiments, the connecting films DA may be, for example, a semiconductor die attach film, a layer made of adhesives or epoxy resin, or the like.

In some embodiments, the semiconductor dies 130 each include a semiconductor substrate 130$s$ having an active surface 130$a$ and the backside surface 130$f$ opposite to the active surface 130$a$, a plurality of pads 130$b$ distributed on the active surface 130$a$, a passivation layer 130$c$ covering the active surface 130$a$ exposed by the pads 130$b$ and a portion of the pads 130$b$, a plurality of conductive vias 130$d$ connected to the portion of the pads 130$b$ exposed by the passivation layer 130$c$ and a portion of the passivation layer 130$c$, and a protection layer 130$e$ covering the conductive vias 130$d$ and the passivation layer 130$c$ exposed by the conductive vias 130$d$. The pads 130$b$ are partially covered by the passivation layer 130$c$, the conductive vias 130$d$ are directly disposed on and electrically connected to the pads 130$b$ exposed by the passivation layer 130$c$, and the protection layer 130$e$ covers the passivation layer 130$c$ and the conductive vias 130$d$.

In an alternative embodiment, the conductive vias 130$d$ and the protection layer 130$e$ may be omitted from the semiconductor dies 130; that is, the semiconductor dies 130 each may include the semiconductor substrate 130$s$ having the active surface 130$a$ and the backside surface 130$f$ opposite to the active surface 130$a$, the pads 130$b$ distributed on the active surface 130$a$, and the passivation layer 130$c$ covering the active surface 130$a$ and the pads 130$b$. The disclosure is not limited thereto.

The material of the semiconductor substrate 130$s$ may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130$s$ may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 130$s$ may further include an interconnection structure (not shown) disposed on the active surface 130$a$. In certain embodiments, the interconnection structure may include one or more inter-dielectric layers and one or more patterned conductive layers stacked alternately for providing routing function to the active components and the passive components embedded in the semiconductor substrate 130$s$, where the pads 130$b$ may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the pads 130$b$ may be aluminum pads or other suitable metal pads. In some embodiments, the conductive vias 130$d$ are copper pillars, copper alloy pillar or other suitable metal pillars, for example. In some embodiments, the passivation layer 130$c$ and/or the protection layer 130$e$ may be a PBO layer, a PI layer or other suitable polymers. In some alternative embodiments, the passivation layer 130$c$ and/or the protection layer 130$e$ may be made of inorganic materials, such as silicon oxide, silicon nitride, silicon oxynitride, or any suitable dielectric material. In certain embodiments, the materials of the passivation layer 130$c$ and the protection layer 130$e$ may be the same or different, the disclosure is not limited thereto.

In some embodiments, each of the semiconductor dies 130 described herein may be referred to as a chip or an integrated circuit (IC). In some embodiments, the semiconductor dies 130 may include chip(s) of the same type or different types. For example, the semiconductor dies 130 may include digital chips, analog chips, or mixed signal chips, such as application-specific integrated circuit ("ASIC") chips, sensor chips, wireless and radio frequency (RF) chips, memory chips, logic chips, voltage regulator chips, or combinations thereof. For example, the semiconductor dies 130 include wireless and radio frequency (RF) chips. For another example, some of the semiconductor dies 130 include wireless and radio frequency (RF) chips, and the rest of the semiconductor dies 130 include memory chips. In an alternative embodiment, the semiconductor dies 130, one or all, may be referred to as a chip or a IC of combination-type. For example, at least one of the semiconductor dies 130 may be a WiFi chip simultaneously including both of a RF chip and a digital chip. The disclosure is not limited thereto.

Figure 2:
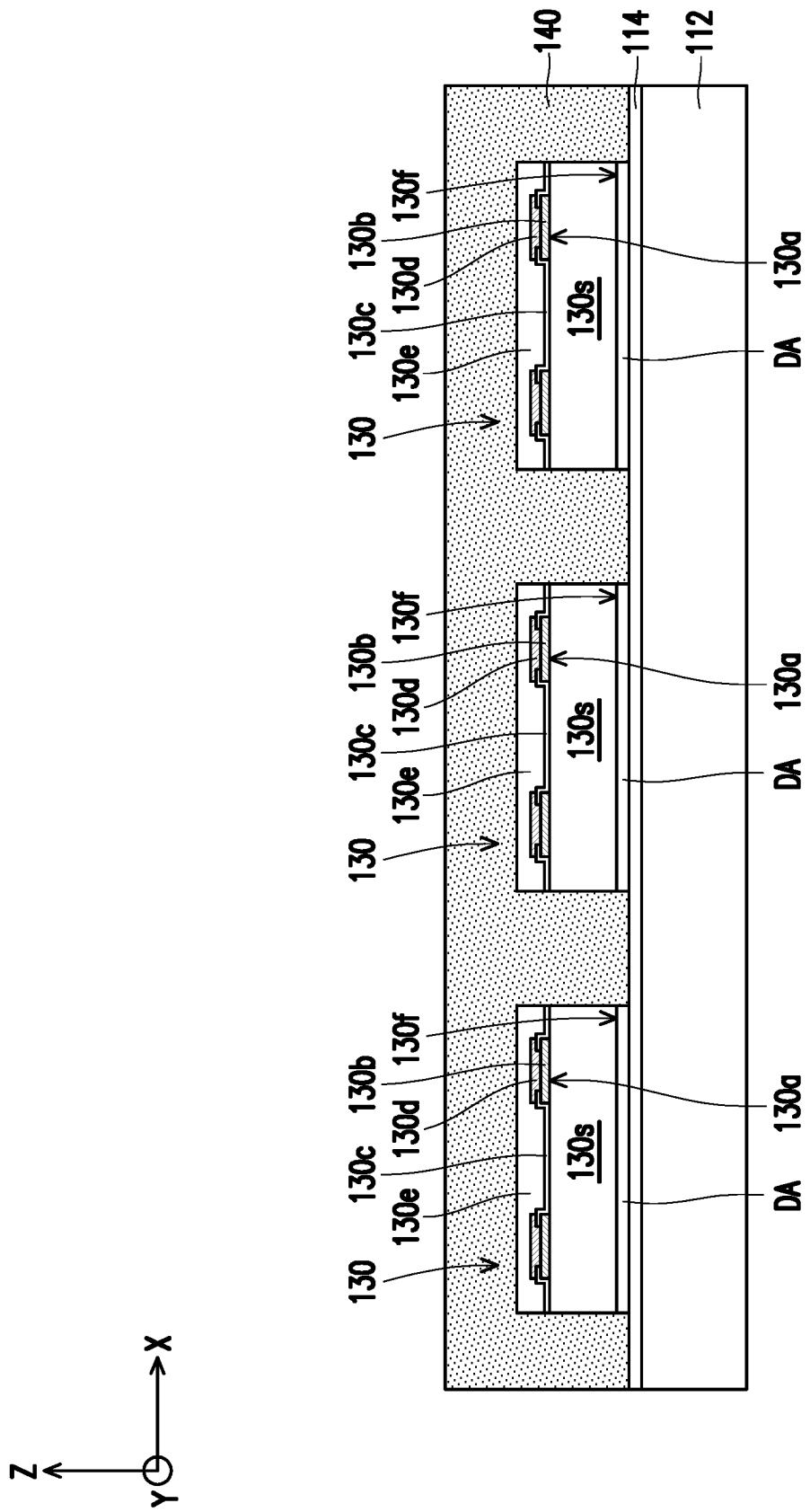

Referring to FIG. 2, in some embodiments, the semiconductor dies 130 are encapsulated in an insulating encapsulation 140. In some embodiments, the insulating encapsulation 140 is formed on the debond layer 114 and over the carrier 112. As shown in FIG. 2, the insulating encapsulation 140 at least fills up the gaps between the semiconductor dies 130, between the connecting films DA, and between the semiconductor dies 130 and the connecting films DA. In some embodiments, the insulating encapsulation 140 covers the semiconductor dies 130 and the debond layer 114 exposed by the semiconductor dies 130. As shown in FIG. 2, the semiconductor dies 130 and the debond layer 114 are not accessibly revealed by the insulating encapsulation 140, for example.

In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 3:
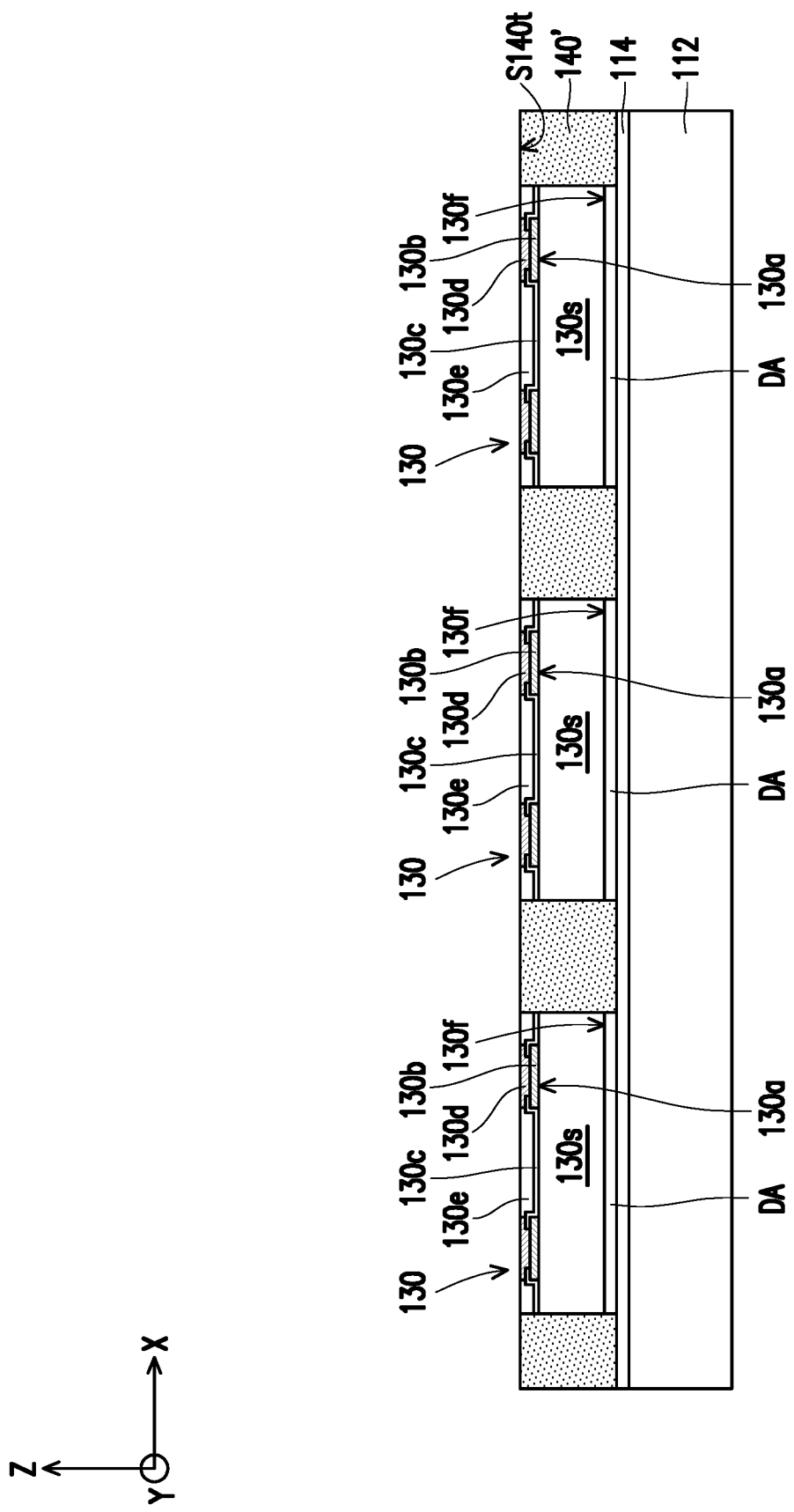

Referring to FIG. 3, in some embodiments, the insulating encapsulation 140 is planarized to form an insulating encapsulation 140' exposing the semiconductor dies 130. In certain embodiments, as shown in FIG. 3, after the planarization, top surfaces of the conductive pillars 130d and the protection layer 130e (of each of the semiconductor dies 130) are exposed by a top surface S140t of the insulating encapsulation 140'. That is, for example, the top surfaces of the conductive pillars 130d and the protection layer 130e of each of the semiconductor dies 130 become substantially leveled with the top surface S140t of the insulating encapsulation 140'. In other words, the top surfaces of the conductive pillars 130d and the protection layer 130e of each of the semiconductor dies 130 and the top surface S140t of the insulating encapsulation 140' are substantially coplanar to each other. In some embodiments, as shown in FIG. 3, the semiconductor dies 130 are accessibly revealed by the insulating encapsulation 140'. That is, for example, the conductive vias 130d and the protection layers 130e of the semiconductor dies 130 are accessibly revealed by the insulating encapsulation 140'.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive pillars 130d and the protection layer 130e of each of the semiconductor dies 130 may also be planarized. In certain embodiments, the planarizing step may, for example, performed on the over-molded insulating encapsulation 140 to level the top surface S140t of the insulating encapsulation 140' and the top surfaces of the conductive pillars 130d and the protection layer 130e of each of the semiconductor dies 130. With this, the conductive pillars 130d of each of the semiconductor dies 130 are exposed from the insulating encapsulation 140' for electrically connecting with later-formed elements/features.

Figure 4:
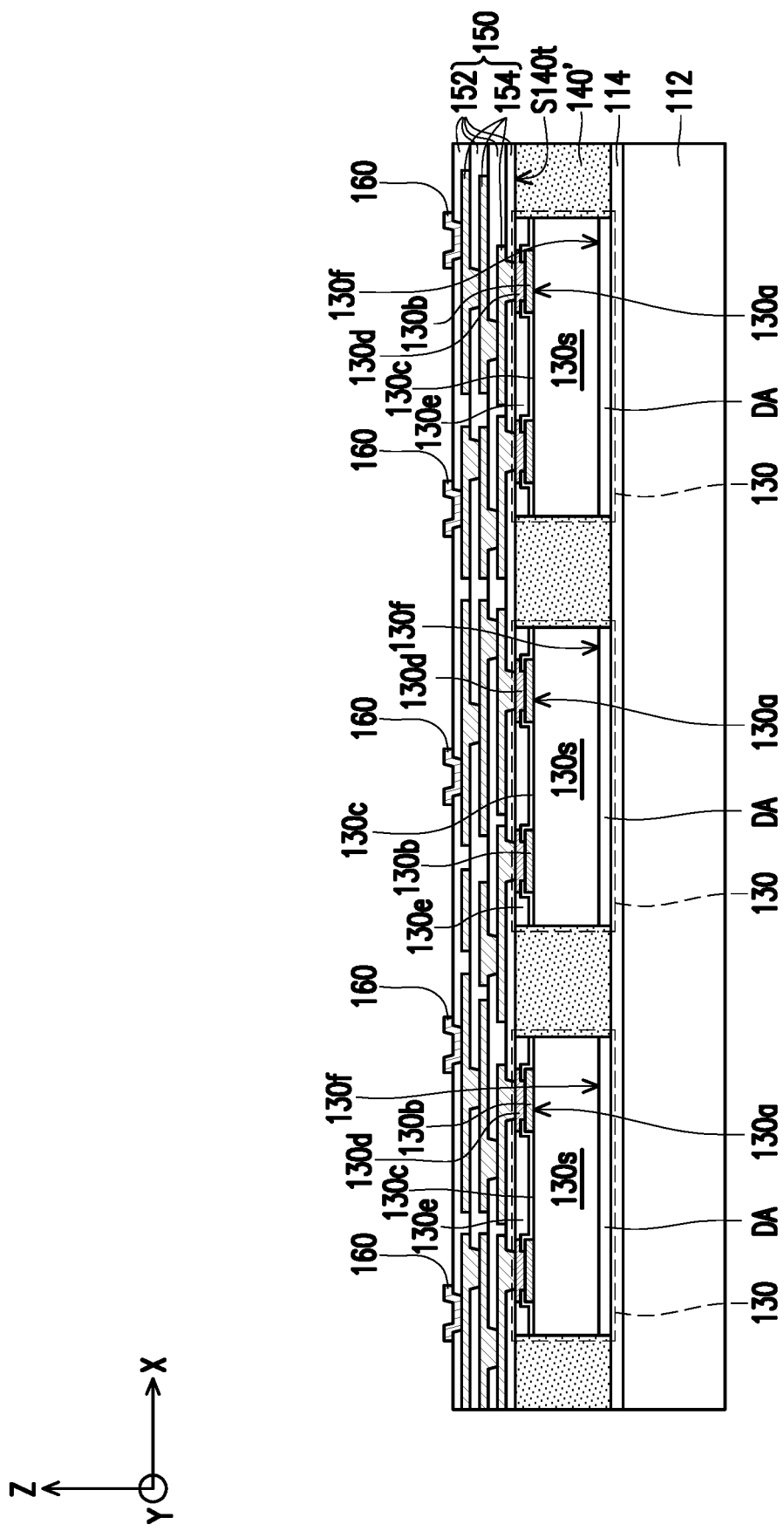

Referring to FIG. 4, in some embodiments, a redistribution circuit structure 150 is formed on the semiconductor dies 130 and the insulating encapsulation 140'. As shown in FIG. 4, the redistribution circuit structure 150 is formed on the top surfaces (of the conductive pillars 130d and the protection layers 130e) of the semiconductor dies 130 and the top surface S140t of the insulating encapsulation 140'. In some embodiments, the redistribution circuit structure 150 is electrically connected to the semiconductor dies 130 through the conductive pillars 130d. As shown in FIG. 4, for example, the redistribution circuit structure 150 is referred to as a front-side redistribution layer of the semiconductor dies 130 for providing routing function. That is, the semiconductor dies 130 are electrically communicated to each other through the redistribution circuit structure 150. In some embodiments, as shown in FIG. 4, along a stacking direction (e.g. a direction Z depicted in FIG. 4) of the semiconductor dies 130 and the redistribution circuit structures 150, the semiconductor dies 130 are directly located between the redistribution circuit structure 150 and the connecting films DA, the connecting films DA are directly located between the semiconductor dies 130 and the debond layer 114, and the insulating encapsulation 140' is directly located between the redistribution circuit structure 150 and the debond layer 114.

In some embodiments, the formation of the redistribution circuit structure 150 includes sequentially forming one or more dielectric layers 152 and one or more metallization layers 154 in alternation. In certain embodiments, as shown in FIG. 4, the metallization layers 154 are sandwiched between the dielectric layers 152, where the top surface of a topmost layer of the metallization layers 154 is exposed by a topmost layer of the dielectric layers 152 and the bottom surface of a lowest layer of the metallization layers 154 is exposed by a lowest layer of the dielectric layers 152 to electrically connect the conductive pillars 130d of the semiconductor dies 130.

In some embodiments, the material of the dielectric layers 152 may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 152 formed by suitable fabrication techniques such as spin-on coating process, chemical vapor deposition (CVD) process (such as plasma-enhanced chemical vapor deposition (PECVD) process), or the like. The disclosure is not limited thereto. In some embodiments, the material of the metallization layer 154 may be made of conductive materials formed by electroplating or deposition, such as aluminum, titanium, copper, nickel, tungsten, and/or alloys thereof, which may be patterned using a photolithography and etching process. In some embodiments, the metallization layer 154 may be patterned copper layers or other suitable patterned metal layers. It should be noted that the redistribution circuit structure 150 is not limited to include three dielectric layers 152 and/or two metallization layers 154. For example, the numbers of the dielectric layers 152 and the metallization layers 154 may be one or more than one.

Continued on FIG. 4, in some embodiments, a plurality of under-bump metallurgy (UBM) patterns 160 may be disposed on the exposed top surfaces of the topmost layer of the metallization layers 154 for electrically connecting with conductive elements (e.g. conductive balls or conductive bumps). As shown in FIG. 4, for example, the UBM patterns 160 are formed on and electrically connected to the redistribution circuit structure 150. The materials of the UBM patterns 160 may include copper, nickel, titanium, tungsten, or alloys thereof or the like, and may be formed by an electroplating process, for example. The number of the UBM patterns 160 is not limited in this disclosure, and corresponds to the number of portions of the top surface of the topmost layer of the metallization layers 154 exposed by the topmost layer of the dielectric layers 152.

Figure 5:
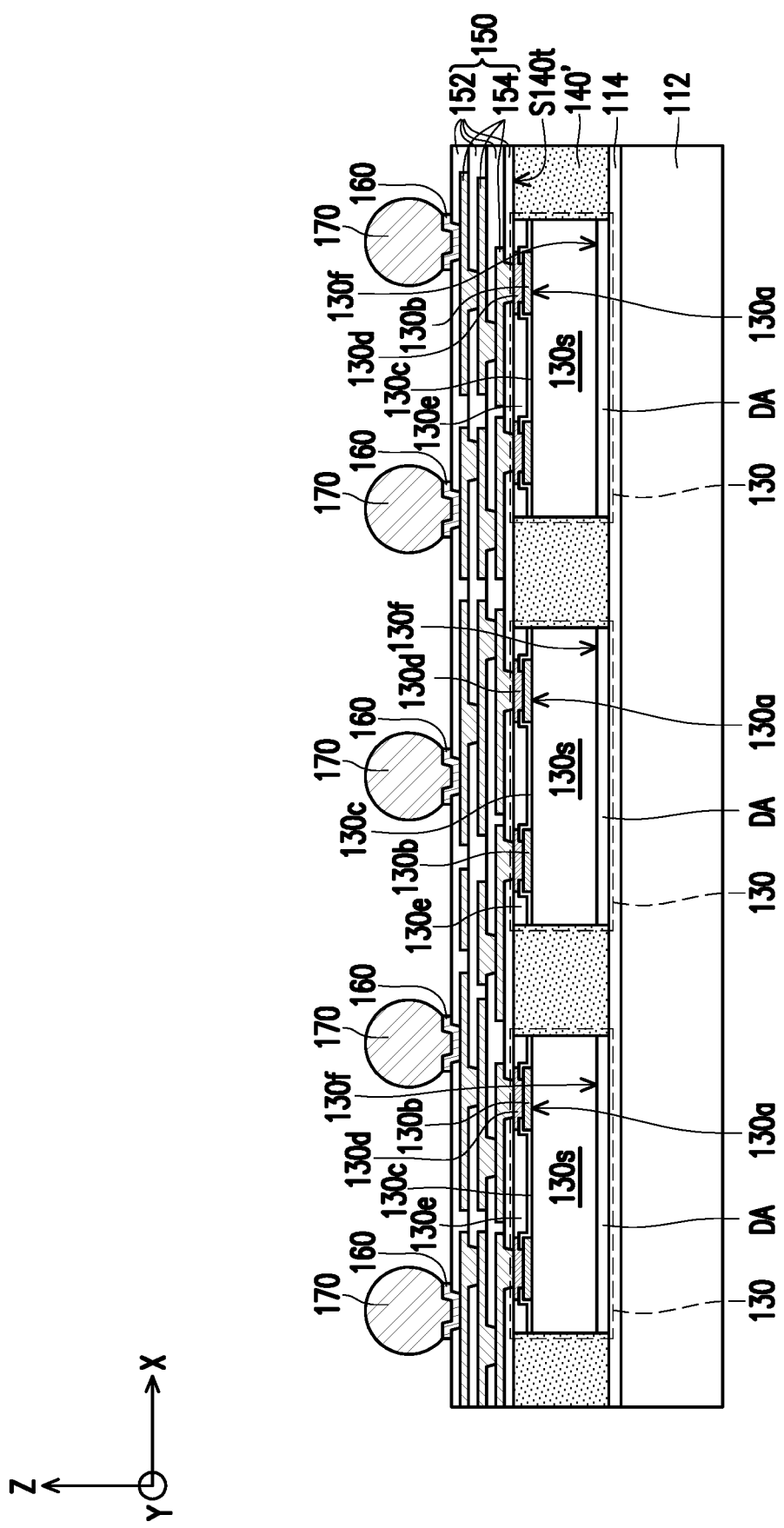

Referring to FIG. 5, in some embodiments, after the redistribution circuit structure 150 is formed, a plurality of conductive elements 170 are formed over the semiconductor dies 130. As shown in FIG. 5, the conductive elements 170 are disposed on the UBM patterns 160 over the redistribution circuit structure 150, for example. In one embodiment, the conductive elements 170 may include micro-bumps (μ-bump), where the micro-bumps may be solder bumps, and/or may include metal pillars (e.g., copper pillars), solder caps formed on metal pillars, and/or solder bumps between two metal pillars, and/or the like. In an alternative embodiment, the conductive elements 170 are, for example, controlled collapse chip connection (C4) bumps (for example, which may have, but not limited to, a size of about 80 μm) or ball grid array (BGA) balls (for example, which may have, but not limited to, a size of about 400 μm). In a further alternative embodiment, the conductive elements 170 are, for example, solder balls or BGA balls. The number of the conductive elements 170 is not limited to the disclosure, and may be designated and selected based on the number of the UBM patterns 160. When solder is used, the solder may include either eutectic solder or non-eutectic solder. The solder may include lead or be lead-free, and may include Sn—Ag, Sn—Cu, Sn—Ag—Cu, or the like. In some embodiments, the conductive elements 170 may be disposed on the UBM patterns 160 by a suitable process such as evaporation, electroplating, ball drop, or screen printing. In some embodiments, the conductive elements 170 may be disposed on the UBM patterns 160 by ball placement process or reflow process. The disclosure is not limited thereto, where the type and the forming method of the conductive elements 170 may be determined based on the demand and the design layout. In the disclosure, for one embodiment, the conductive elements 170 may be referred to as conductive connectors for connecting with another package; or for another embodiment, the conductive elements 170 may be referred to as conductive terminals for inputting/outputting electric and/or power signals.

In some embodiments, as shown in FIG. 5, the conductive elements 170 are connected to the redistribution circuit structure 150 through the UBM patterns 160, where the UBM patterns 160 is sandwiched between the redistribution circuit structure 150 and the conductive elements 170. In some embodiments, some of the conductive elements 170 are electrically connected to one or more than one the semiconductor dies 130 through the UBM patterns 160 and the redistribution circuit structure 150. However, the disclosure is not limited thereto; in some alternative embodiments, the UBM patterns 160 may be omitted. For example, the conductive elements 170 may directly disposed on the redistribution circuit structure 150 (e.g. the topmost layer of the metallization layers 154 exposed by the topmost layer of the dielectric layers 152).

Figure 6:
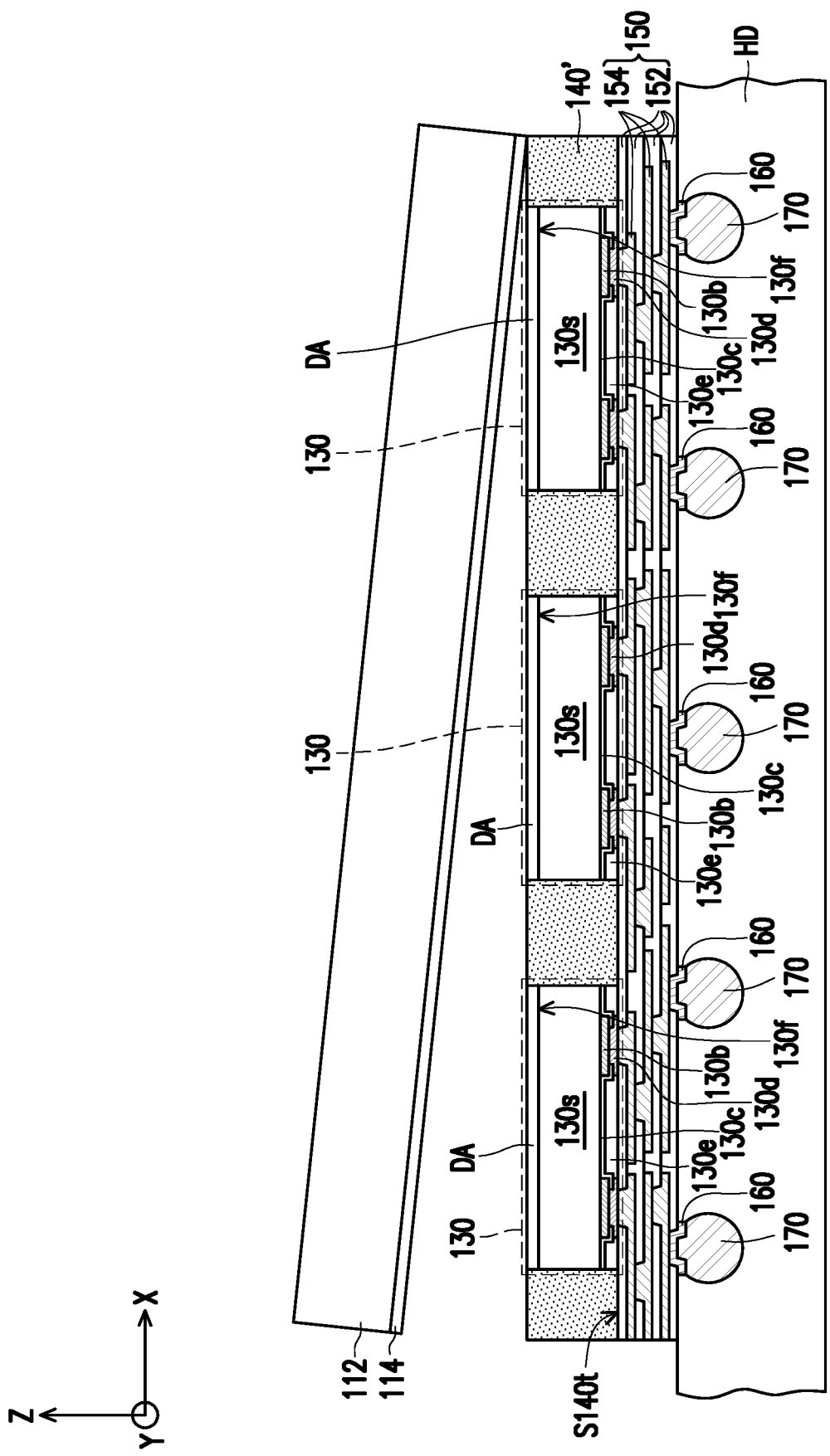

Referring to FIG. 6, in some embodiments, the whole structure depicted in FIG. 5 along with the carrier 112 is flipped (turned upside down), where the conductive elements 170 are placed to a holding device HD, and the carrier 112 is then debonded from the insulating encapsulation 140' and the connecting films DA. In some embodiments, the holding device HD includes a polymer film, and the conductive elements 170 are mounted into the polymer film as shown in FIG. 6. For example, the material of the polymer film may include a polymer film having sufficient elasticity to allow the conductive elements 170 being embedded therein. In certain embodiments, the holding device HD may be a parafilm or a film made of other suitable soft polymer materials or the like. In an alternative embodiment, the holding device HD may be an adhesive tape, a carrier film or a suction pad. The disclosure is not limited thereto.

In some embodiments, the insulating encapsulation 140' and the connecting films DA are easily separated from the carrier 112 due to the debond layer 114. In some embodiments, the carrier 112 is detached from the insulating encapsulation 140' and the connecting films DA through a debonding process, where the carrier 112 and the debond layer 114 are removed and the insulating encapsulation 140' and the connecting films DA are exposed, as show in FIG. 6. In one embodiment, the debonding process is a laser debonding process. During the debonding step, the holding device HD is used to secure the structures depicted in FIG. 5 before debonding the carrier 112 and the debond layer 114.

Figure 7:
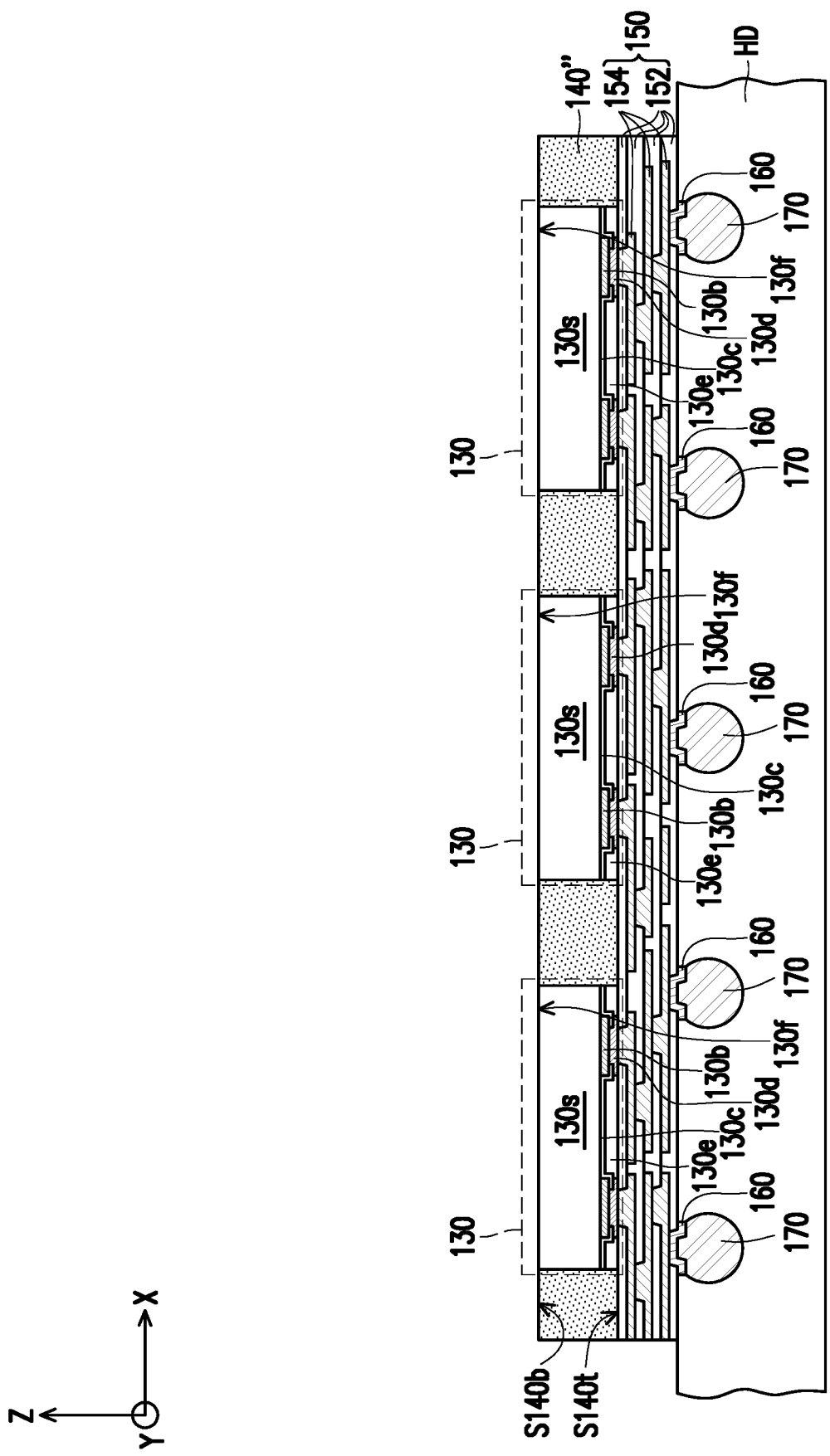

Referring to FIG. 7, in some embodiments, after the debonding the carrier 112 and the debond layer 114 from the insulating encapsulation 140' and the connecting films DA, a planarizing process is performed on the insulating encapsulation 140' to form an insulating encapsulation 140" exposing the backside surfaces 130f of the semiconductor dies 130. That is, during planarizing the insulating encapsulation 140', in addition to the removal of a portion of the insulating encapsulation 140', the connecting films DA disposed on the backside surfaces 130f of the semiconductor dies 130 are completely removed, and thus the backside surfaces 130f of the semiconductor dies 130 are exposed. In some embodiments, the backside surfaces 130f of the semiconductor dies 130 are substantially leveled with and coplanar to a bottom surface S140b of the insulating encapsulation 140" (which is opposite to the top surface S140t of the insulating encapsulation 140"/140'). As shown in FIG. 7, the backside surfaces 130f of the semiconductor dies 130 are accessibly revealed by the insulating encapsulation. That is, the backside surfaces 130f of the semiconductor dies 130 are free of the connecting films DA.

The insulating encapsulation 140' may be planarized by mechanical grinding or CMP, for example. After the planarizing process, a cleaning step may be optionally performed, for example to clean and remove the residue generated from the planarizing process. However, the disclosure is not limited thereto, and the planarizing process may be performed through any other suitable method.

Figure 8:
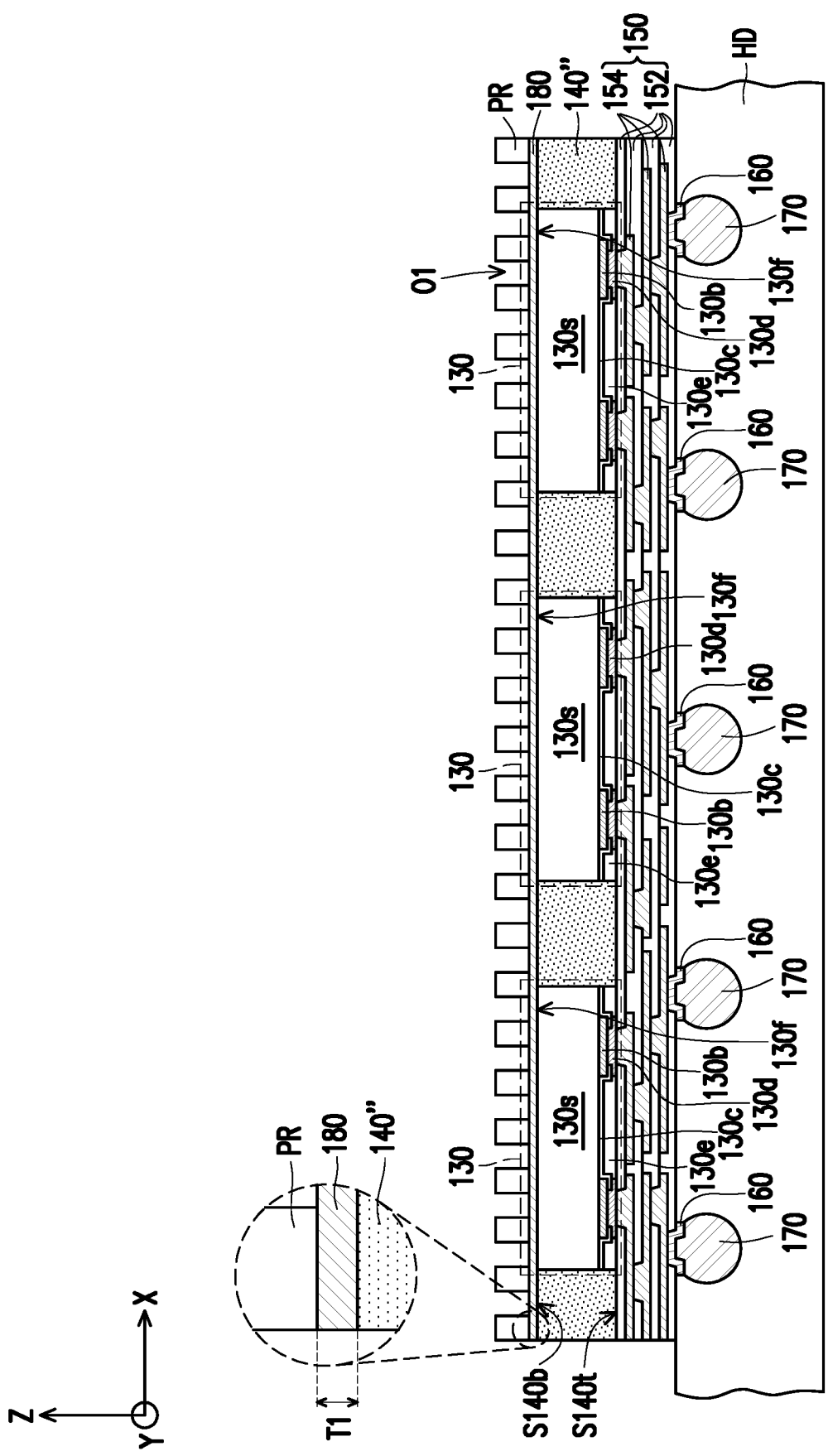

Referring to FIG. 8, in some embodiments, a metallization layer 180 is formed on the backside surfaces 130f of the semiconductor dies 130 and the bottom surface S140b of the insulating encapsulation 140". In some embodiments, the metallization layer 180 may be a single layer or a composite layer having a plurality of sub-layers formed of different materials made of metal or metal alloy, which may include copper, nickel, titanium, tungsten, alloys thereof or other suitable choice of materials. The metallization layer 180 may be, for example, formed through a sputtering process, a PVD process, or the like. In some embodiments, the metallization layer 180 is conformally formed to be in direct contact with the backside surfaces 130f of the semiconductor dies 130 and the bottom surface S140b of the insulating encapsulation 140". As shown in FIG. 8, the metallization layer 180 is in physical contact with the semiconductor substrates 130s of the semiconductor dies 130, and the metallization layer 180 is thermally coupled to the semiconductor dies 130. In some embodiments, a thickness T1 of the metallization layer 180 is approximately ranging from 50 nm to 1000 nm.

Thereafter, a photoresist layer PR is formed over the metallization layer 180, where the photoresist layer PR includes at least one opening O1 exposing a portion of the metallization layer 180, for example. In some embodiments, as shown in FIG. 8, a plurality of openings O1 are formed in the photoresist layer PR to expose portions of the metallization layer 180. In one embodiment, the photoresist layer PR may be formed by coating and photolithography processes or the like. The number and shape of the openings O1 may, for example, correspond to the number and shape of later-formed conductive structure(s) (such as a conductive pillar, conductive via, or conductive pins), the disclosure is not limited thereto. In some embodiments, a material of the photoresist layer PR, for example, includes a positive resist material or a negative resist material, that is suitable for a patterning process such as a photolithography process with a mask or a mask-less photolithography process (for instance, an electron-beam (e-beam) writing or an ion-beam writing).

Figure 9:
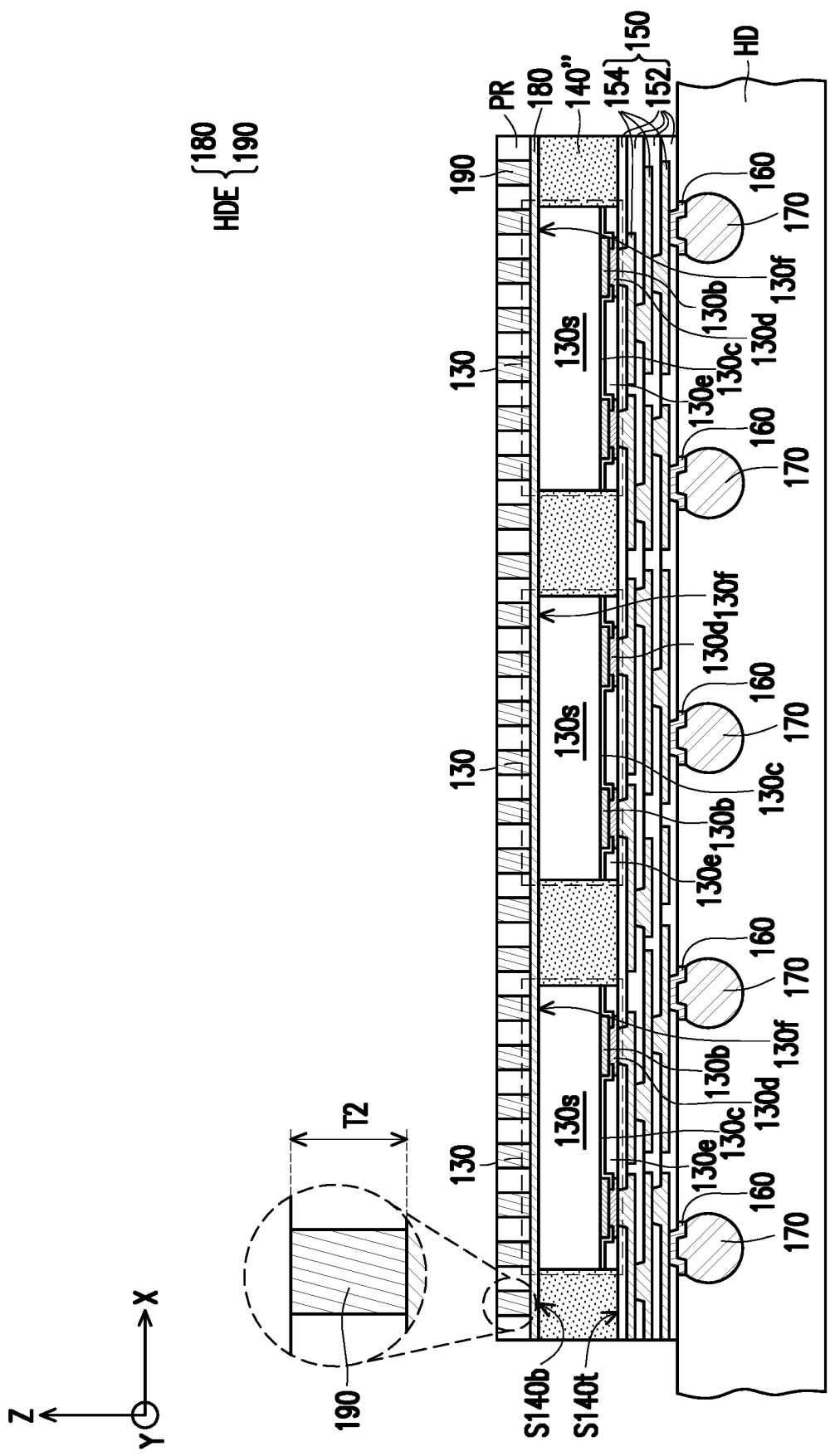

Referring to FIG. 9, in some embodiments, a plurality of conductive patterns 190 are formed on the metallization layer 180. In some embodiments, a conductive material (not shown) is formed to fill into the openings O1 formed in the photoresist layer PR by a plating process. The plating process is, for example, electro-plating, electroless-plating, immersion plating, or the like. In some embodiments, the conductive material includes, for example, copper, copper alloys, or the like. The number and shape of the conductive patterns 190 can be selected based on the demand, and adjusted by changing the number and shape of the openings O1 formed in the photoresist layer PR.

As shown in FIG. 9, the conductive patterns 190 are directly located on the metallization layer 180 and in the openings O1 of the photoresist layer PRE where the conductive patterns 190 is in physical and electrical contact with the metallization layer 180, for example. Owing to such configuration, the conductive patterns 190 are thermally coupled to the semiconductor dies 130 through the metallization layer 180. In the disclosure, the metallization layer 180 and the conductive patterns 190 are together to as a heat dissipating element HDE which facilitates heat dissipation of the (semiconductor) package. In some embodiments, the heat dissipating element HDE is thermally coupled and electrically isolated to the semiconductor dies 130. In some embodiments, as shown in FIG. 9, on the X-Y plane along the direction Z, an orthogonal projection of the metallization layer 180 of the heat dissipating element HDE is fully overlaps with an orthogonal projection of the insulating encapsulation 140" and the semiconductor dies 130". In some embodiments, a ratio of an orthogonal projection of all of the conductive patterns 190 to an orthogonal projection of the metallization layer 180 approximately ranges from 0.30 to 0.80. In some embodiments, a thickness T2 of the conductive patterns 190 is approximately ranging from 20 µm to 100 µm.

In some embodiments, as shown in FIG. 9 and FIG. 16, along the X-Y plane, the conductive patterns 190 are arranged in a matrix form on the metallization layer 180, such as the N×N array or N×M arrays (N, M>0, N may or may not be equal to M). The size of the array for the conductive patterns 190 can be designated and selected based on the demand, and is not limited to the disclosure. However, the disclosure is not limited thereto, in an alternative embodiment, the conductive patterns 190 are randomly arranged over the metallization layer 180. In some embodiments, a width W of each of the conductive patterns 190 approximately ranges from 20 µm to 500 µm, and a spacing distance SP between any two adjacent conductive patterns 190 approximately ranges from XXX to XXX. Owing to the heat dissipating element HDE (including the metallization layer 180 and the conductor patterns 190), the thermal dissipation ability of the (semiconductor) package is greatly enhanced. For example, a shape of the conductive patterns 190 may have a substantially circular shape (for top view depicted in FIG. 16), however the disclosure is not limited thereto. In other embodiments, the shape of the conductive patterns 190 may be ellipse, oral, square, rectangular or any suitable polygonal shape.

Figure 10:
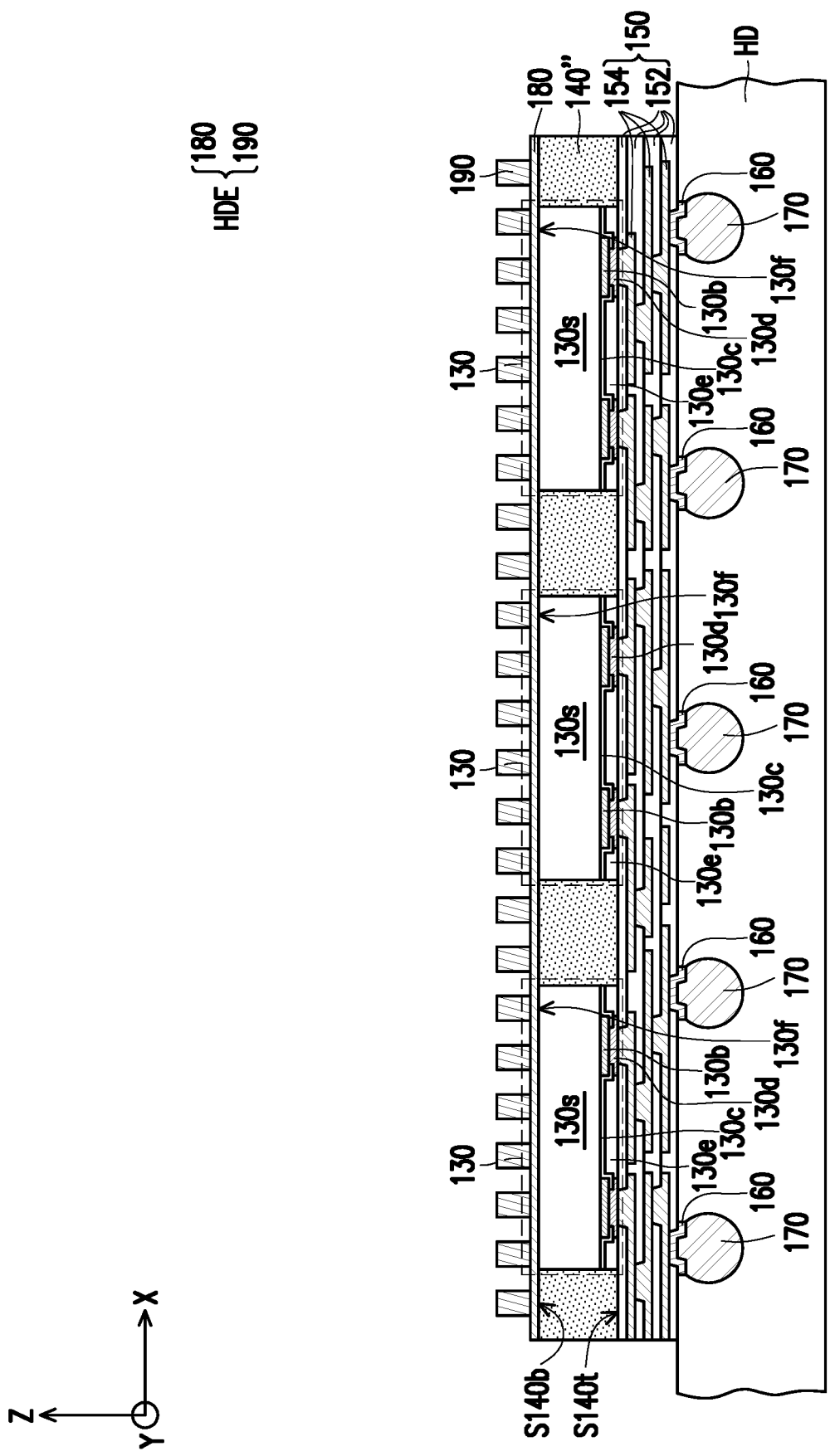

Referring to FIG. 10, in some embodiments, after the formation of the conductive patterns 190, the photoresist layer PR is removed. In some embodiment, the photoresist layer PR is removed by acceptable ashing process and/or photoresist stripping process, such as using an oxygen plasma or the like. The disclosure is not limited thereto.

Figure 11:
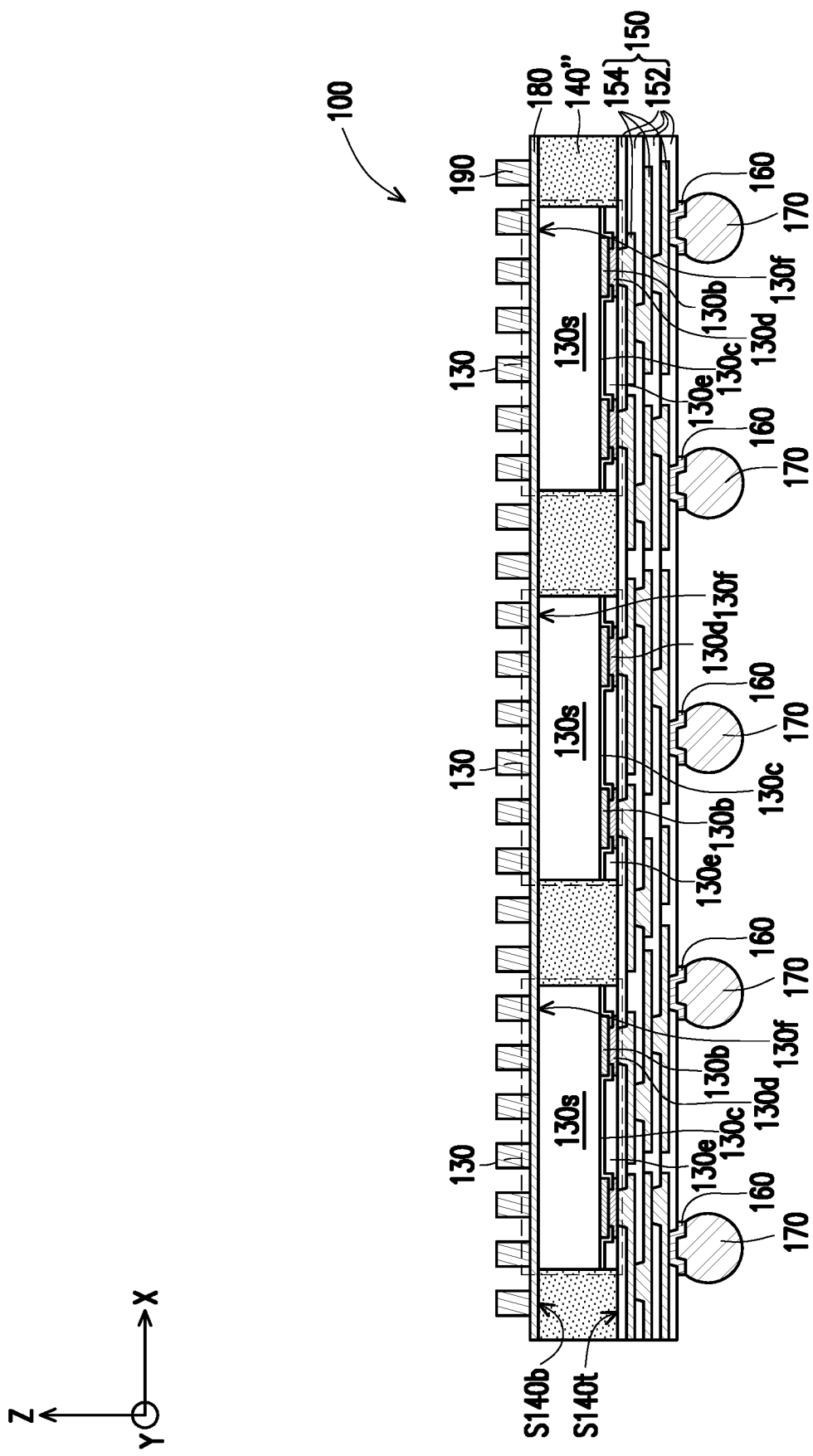

Referring to FIG. 11, in some embodiments, the conductive elements 170 are released from the holding device HD to form a package 100. In some embodiments, a dicing process may be performed to cut a plurality of the packages 100 interconnected therebetween into individual and separated packages 100 before releasing the conductive elements 170 from the holding device HD. In one embodiment, the dicing process is a wafer dicing process including mechanical blade sawing or laser cutting. Up to here, the manufacture of the package 100 is completed. The package 100 may be referred to as an integrated fan-out package, in some embodiments.

In some alternative embodiments, the package 100 may be further mounted with a circuit substrate, an interposer, an additional package, chips/dies or other electronic devices to form a stacked package structure through the conductive elements 170 and/or other additional connectors based on the design layout and the demand. For illustration, examples are provided as follows (e.g., a package PS1 of FIG. 12 and FIG. 13 and a package PS2 of FIG. 14 and FIG. 15), but the disclosure is not limited thereto.

Figure 12:
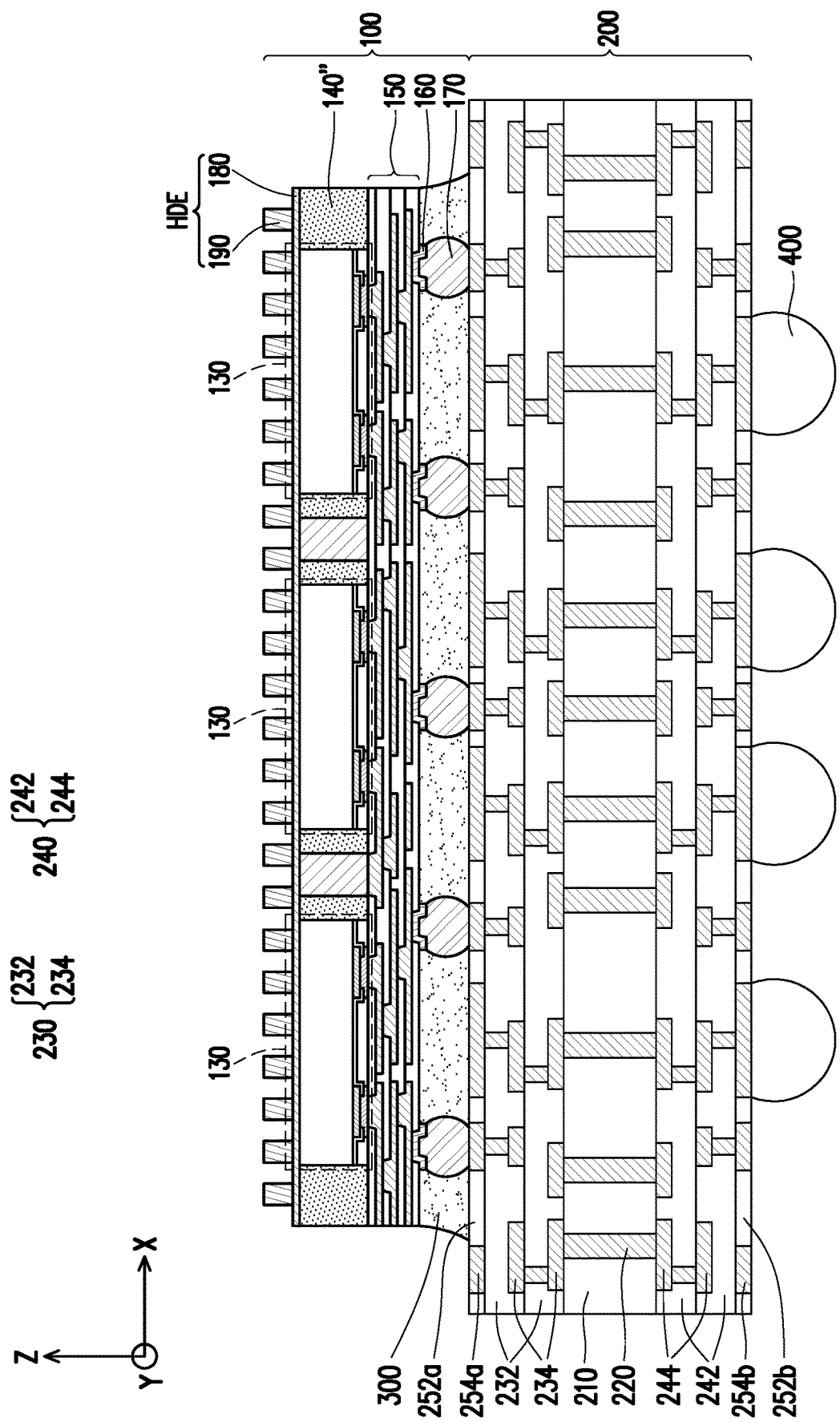
FIG. 12 to FIG. 13 are schematic cross-sectional views of various stages in a manufacturing method of a package in accordance with some embodiments of the disclosure.

Referring to FIG. 12, in some embodiments, a circuit element 200 is provided. In some embodiments, the carrier element 200 includes a core portion 210, a plurality of vias 220, a redistribution circuit structure 230, a redistribution circuit structure 240, a plurality of bonding pads 252a, a plurality of bonding pads 254b, a solder mask layer 254a, and a solder mask layer 245b.

Figure 13:
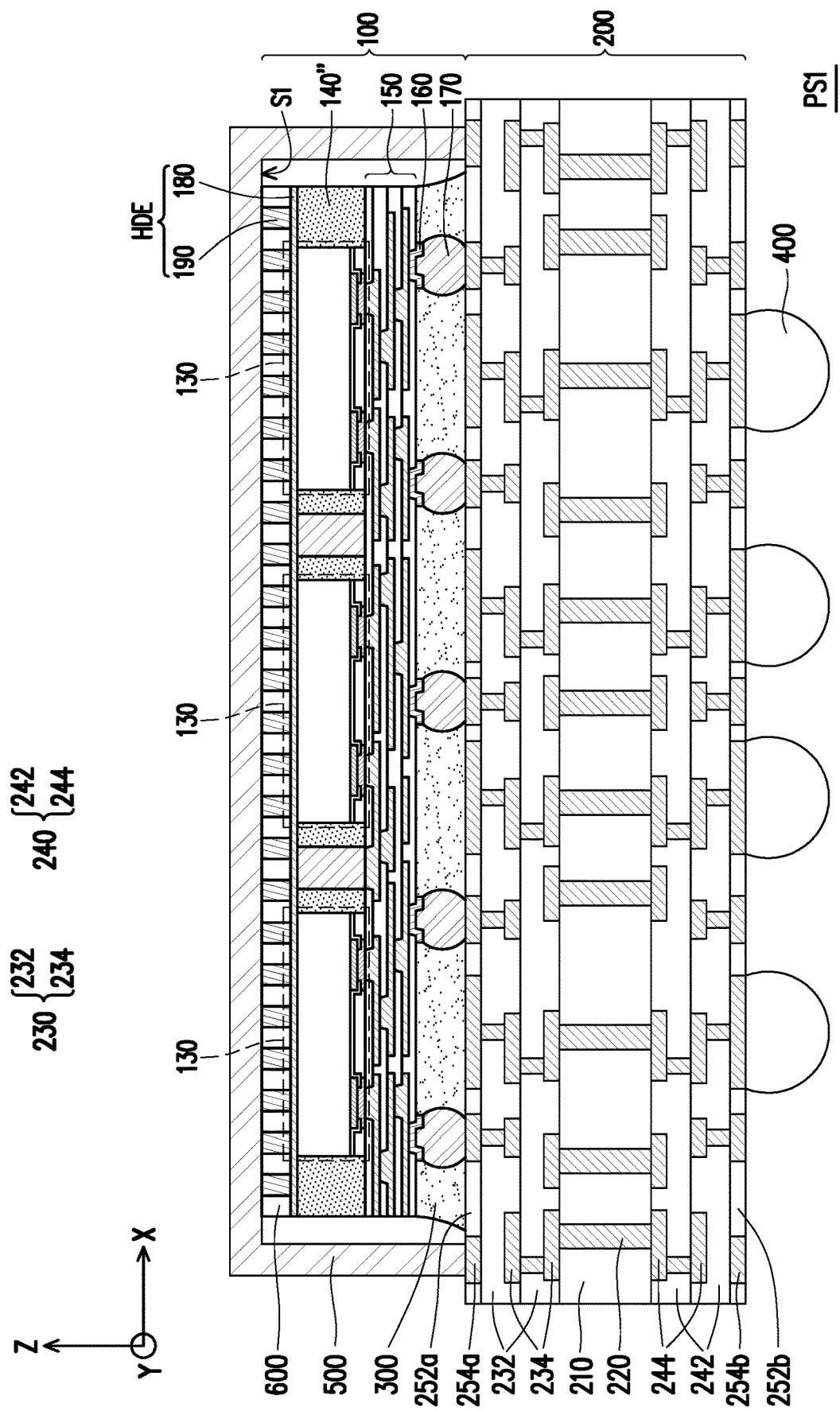

In some embodiments, the core portion 210 may include a dielectric layer made of PI, PBO, BCB, a nitride such as silicon nitride, an oxide such as silicon oxide, PSG, BSG, boron-doped BPSG, a combination thereof or the like. In the embodiments of which the core portion 210 is the dielectric layer, the vias 220 is through insulator vias penetrating the core portion and the conductive elements 170 includes C4 bumps or BGA balls, such that the circuit element 200 is referred to as a circuit substrate, as shown in FIG. 12 to FIG. 13. For example, the circuit element 200 may be an organic substrate with circuitry. In some embodiments, the material of the vias 220, for example, may include copper, copper alloy, or the like, the disclosure is not limited thereto.

However, the disclosure is not limited thereto; in some alternative embodiments, the core portion 210 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In the embodiments of which the core portion 210 is the silicon substrate, the vias 220 is through silicon vias penetrating the core portions 210 and the conductive elements 170 includes micro-bumps, such that the circuit element 200 is referred to as an interposer (see FIG. 14 to FIG. 15).

In some embodiments, the redistribution circuit structure 230 and the redistribution circuit structure 240 respectively disposed on two opposite sides of the core portion 210, as shown in FIG. 12. In some embodiments, the redistribution circuit structure 230 and/or the redistribution circuit structure 240 are electrically connected to the vias 220 penetrating the core portion 210. As shown in FIG. 12, the core portion 210 embedded with the vias 220 is located between the redistribution circuit structure 230 and the redistribution circuit structure 240, in some embodiments. Through the vias 220, the redistribution circuit structure 230 and the redistribution circuit structure 240 are electrically connected to each other.

In some embodiments, the redistribution circuit structure 230 includes sequentially forming one or more dielectric layers 232 and one or more metallization layers 234 in alternation, where one metallization layer 234 is sandwiched between two dielectric layers 232. As shown in FIG. 12, portions of a top surface of a topmost layer of the metallization layers 234 are respectively exposed by openings formed in a topmost layer of the dielectric layers 232 for connecting with other conductive features, and portions of a bottom surface of a bottommost layer of the metallization layers 234 are respectively exposed by openings formed in a bottommost layer of the dielectric layers 232 for connecting with the vias 220. The numbers of the metallization layers and the dielectric layers included in the redistribution circuit structure 230 is not limited thereto, and may be designated and selected based on the demand.

In some embodiments, the redistribution circuit structure 240 includes sequentially forming one or more dielectric layers 242 and one or more metallization layers 244 in alternation, where one metallization layer 244 is sandwiched between two dielectric layers 242. As shown in FIG. 12, portions of a top surface of a topmost layer of the metallization layers 244 are respectively exposed by openings formed in a topmost layer of the dielectric layers 242 for connecting with the vias 220, and portions of a bottom surface of a bottommost layer of the metallization layers 244 are respectively exposed by openings formed in a bottommost layer of the dielectric layers 242 for connecting with other conductive features. The numbers of the metallization layers and the dielectric layers included in the redistribution circuit structure 240 is not limited thereto, and may be designated and selected based on the demand.

In certain embodiments, the materials of the dielectric layers 232 and the dielectric layers 242 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 232 and the dielectric layers 242 formed by suitable fabrication techniques such as spin-on coating, CVD, PECVD, or the like. The disclosure is not limited thereto. In one embodiment, the materials of the dielectric layers 232 and the dielectric layers 242 may be the same. In an alternative embodiment, the materials of the dielectric layers 232 and the dielectric layers 242 may be different.

In certain embodiments, the material of the metallization layers 234 and the metallization layers 244 may be made of conductive materials formed by electroplating or deposition, such as aluminum, titanium, copper, nickel, tungsten, and/or alloys thereof, which may be patterned using a photolithography and etching process. In some embodiments, the metallization layers 234 and the metallization layers 244 may be patterned copper layers or other suitable patterned metal layers. In one embodiment, the materials of the metallization layers 234 and the metallization layers 244 may be the same. In an alternative embodiment, the materials of the metallization layers 234 and the metallization layers 244 may be different.

In some embodiments, the bonding pads 254a are disposed on a surface of the redistribution circuit structure 230 and physically connected to the portions of the top surface of the topmost layer of the metallization layers 234 exposed by the openings formed in the topmost layer of the dielectric layers 232, where the bonding pads 254a are physically separated from each other through the solder mask layer 252a formed on the surface of the redistribution circuit structure 230 with the bonding pads 254a disposed thereon. Through the redistribution circuit structure 230, the bonding pads 254a are electrically connected to the vias 220 embedded in the core portion 210.

In some embodiments, the bonding pads 254b are disposed on a surface of the redistribution circuit structure 240 and physically connected to the portions of the bottom surface of the bottommost layer of the metallization layers 244 exposed by the openings formed in the bottommost layer of the dielectric layers 242, where the bonding pads 254b are physically separated from each other through the solder mask layer 252b formed on the surface of the redistribution circuit structure 240 with the bonding pads 254b disposed thereon. In other words, the bonding pads 254a are electrically connected to the redistribution circuit structure 230 and the bonding pads 254b are electrically connected to the redistribution circuit structure 240. Through the redistribution circuit structure 240, the bonding pads 254b are electrically connected to the vias 220 embedded in the core portion 210. In some embodiments, the bonding pads 254a and the bonding pads 254b may include under bump metallurgies (UBMs), however the disclosure is not limited thereto. As shown in FIG. 12, the bonding pads 254a and the bonding pads 254b are electrically connected to each other though the vias 220, the redistribution circuit structure 230, and redistribution circuit structure 240, for example.

In an alternative embodiment, the redistribution circuit structure 230 and the redistribution circuit structure 240, one or both, may be omitted from the circuit element 200, the disclosure is not limited thereto. That is, for example, the circuit element 200 may include a core portion 210, a plurality of vias 220, a plurality of bonding pads 252a, a plurality of bonding pads 254b, a solder mask layer 254a, and a solder mask layer 245b.

Continued on FIG. 12, in some embodiments, the package 100 depicted in FIG. 11 is provided and bonded to the circuit element 200 (e.g. the circuit substrate) to form a package having a stacked structure. The details of the package 100 is described in FIG. 1 to FIG. 11, and thus are not repeated herein. In some embodiments, the package 100 is physically connected to the bonding pads 254a of the circuit element 200 through connecting the conductive elements 170 to the bonding pads 254a by flip chip bonding. In other words, through the conductive elements 170 and the bonding pads 254a, the package 100 is electrically connected to the circuit element 200.

In some embodiments, an underfill 300 is formed on the circuit element 200. As shown in FIG. 12, for example, the underfill 300 at least fills the gaps between the package 100 and the circuit element 200, and wraps sidewalls of the conductive elements 170. In some alternative embodiments, a sidewall of the package 100 may further covered by the underfill 300, the disclosure is not limited thereto. The underfill 300 may be any acceptable material, such as a polymer, epoxy, molding underfill, or the like, for example. In one embodiment, the underfill 300 may be formed by underfill dispensing or any other suitable method. Owing to the underfill 300, the bonding strength between the package 100 and the circuit element 200 are enhanced, thereby improving the reliability thereof.

In some embodiments, a plurality of conductive elements 400 are respectively formed on the bonding pads 254b. As shown in FIG. 12, for example, the conductive elements 400 are physically connected to the bonding pads 254b. In other words, the conductive elements 400 are electrically connected to the circuit element 200 through the bonding pads 254b. Through the bonding pads 254b, some of the conductive elements 400 are electrically connected to the package 100. In some embodiments, the conductive elements 400 are, for example, solder balls or BGA balls.

Referring to FIG. 13, in some embodiments, a heat dissipation lid 500 with a thermal interface material 600 coated on an inner surface S1 thereof is provided, and is bonded to the circuit element 200 to form a package PS1. The heat dissipation lid 500 may have a high thermal conductivity, for example, between about 200 watts per meter kelvin (W/m·K) to about 400 W/m·K or more, and may be formed using a metal, a metal alloy, and the like. The heat dissipation lid 500 is attached to the circuit element 200, in some embodiments, by using lock screws, adhesives (such as a silver paste) or the like, so that the package 100 is arranged within an inner cavity of the heat dissipation lid 500. As shown in FIG. 13, the package 100 is located inside the inner cavity enclosed by the heat dissipation lid 500 and the circuit element 200.

In some embodiments, as shown in FIG. 13, during bonding the heat dissipation lid 500 to the circuit element 200, the conductive patterns 190 are inserted into the thermal interface material 600, thereby the thermal interface material 600 at least fills up the gap between the heat dissipation lid 500 and the heat dissipating element HDE (including the conductive patterns 180 and the metallization layer 190) of the package 100. Owing to such configuration, the package 100 and the heat dissipation lid 500 are stably adhered to each other, and the mechanical strength of the package PS1 is ensured. In some embodiment, the thermal interface material 600 may include any suitable thermally conductive material, for example, a polymer having a good thermal conductivity, which may be between about 3 W/m·K to about 10 W/m·K or more. In some embodiments, the thermal interface material 600 may include an indium sheet, a graphite sheet, or the like.

In some embodiments, as shown in FIG. 13, the conductive patterns 180 of the heat dissipating element HDE (of the package 100) penetrate through the thermal interface material 600 to physically contact the inner surface S1 of the heat dissipation lid 500, and the heat dissipating element HDE, the heat dissipation lid 500, and the thermal interface material 600 are thermally coupled. That is, the heat dissipating element HDE, the heat dissipation lid 500, and the thermal interface material 600 together constitutes a thermal path of heat dissipation for the package PS1. Owing to the heat dissipating element HDE, the thermal performances in the X and/or Y directions and the thermal performance in the Z direction are, respectively, improved by 15 times and 1.5-3.0 times; such that, the reliability of the package PS1 is further enhanced. In addition to dissipating heat for the package PS1, the heat dissipation lid 500 may further provide physical protection to the package 100.

Figure 14:
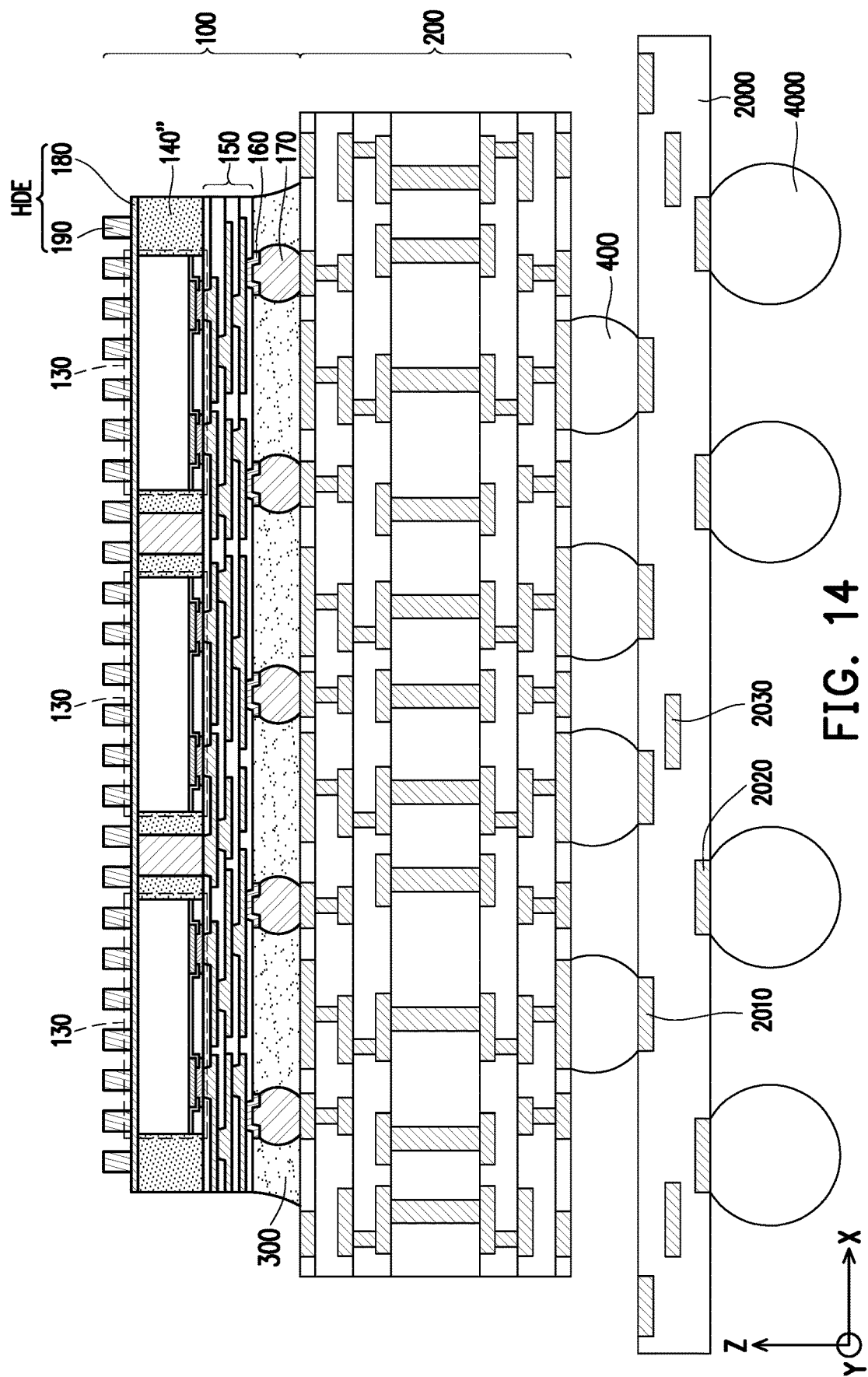
FIG. 14 to FIG. 15 are schematic cross-sectional views of various stages in a manufacturing method of a package in accordance with some embodiments of the disclosure.
Figure 15:
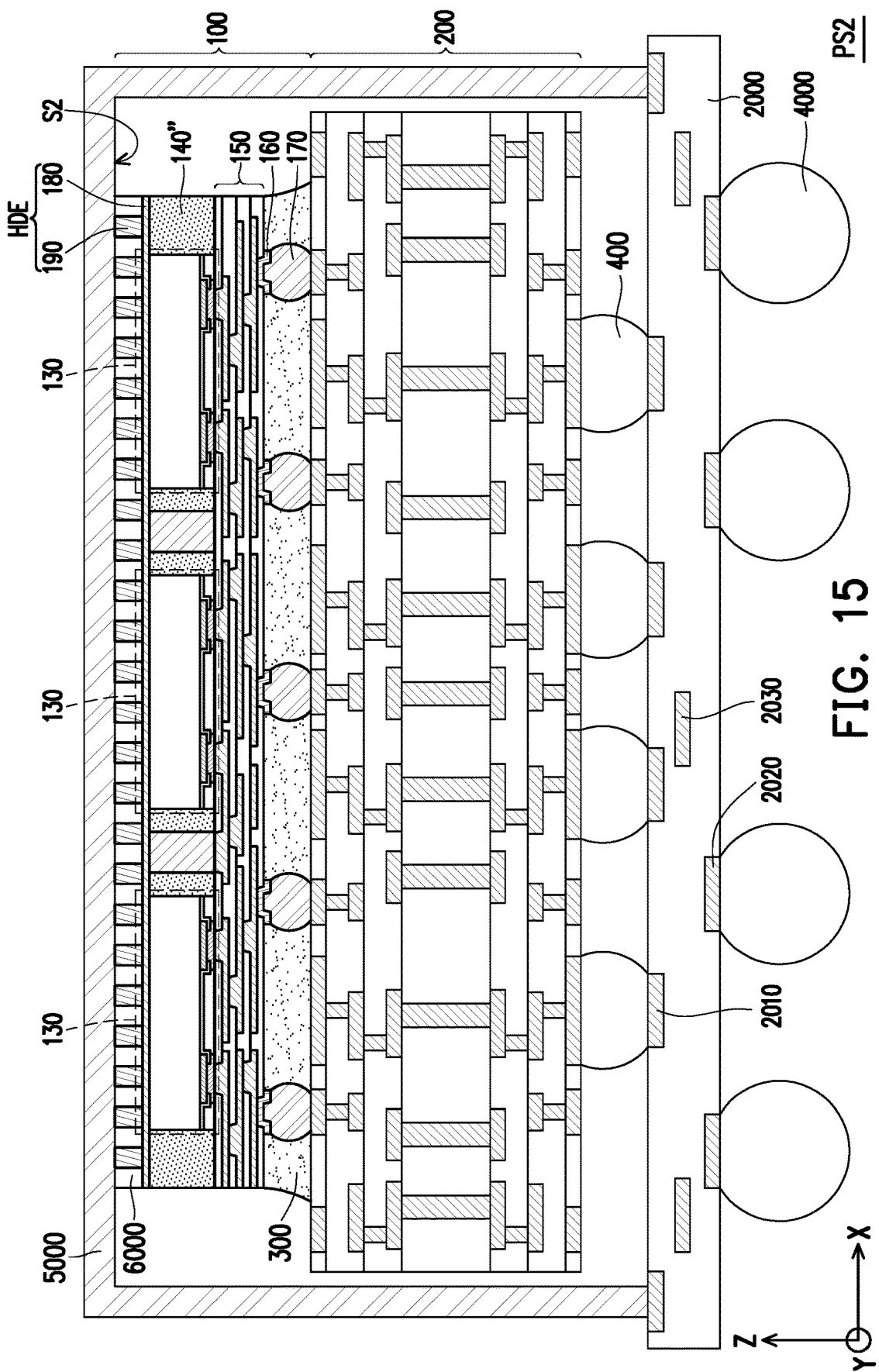

However, the disclosure is not limited thereto. Referring to FIG. 14 and FIG. 15, in the embodiments of which the circuit element 200 is the interposer (where the core portion 210 is a silicon substrate, the vias 220 is through silicon vias penetrating the core portions 210, and the conductive elements 170 is micro-bumps), the stacked structure depicted in FIG. 12 is further disposed on a substrate 2000 to another stacked structure for manufacturing the package PS2. The details of the package 100 is described in FIG. 1 to FIG. 11 and the details of the circuit element 200 is described in FIG. 12, and thus are not repeated herein.

Referring to FIG. 14, in some embodiments, the substrate 2000 is provided. In some embodiments, the substrate 2000 includes contact pads 2010, contact pads 2020, metallization layers 2030, and vias (not shown). In some embodiments, the contact pads 2010 and the contact pads 2020 are respectively distributed on two opposite sides of the substrate 2000, and are exposed for electrically connecting with later-formed elements/features. In some embodiments, the metallization layers 2030 and the vias are embedded in the substrate 2000 and together provide routing function for the substrate 2000, where the metallization layers 2030 and the vias are electrically connected to the contact pads 2010 and the contact pads 2020. That is, the contact pads 2010 are electrically connected to the contact pads 2020 through the metallization layers 2030 and the vias. In some embodiments, the materials of the contact pads 2010 and the contact pads 2020 may be substantially the same or similar to the materials of the bonding pads 254a and the bonding pads 254b, and the materials of the metallization layers 2030 may be substantially the same or similar to the materials of the metallization layers 234 and the metallization layers 244 described in FIG. 12, and thus are not repeated herein for simplicity. In some embodiments, as shown in FIG. 14, the stacked structure depicted in FIG. 12 is bonded to the substrate 2000 through physically connecting the conductive elements 400 and the contact pads 2010, and the package 100 are electrically connected to the substrate 2000 through the circuit element 200. In some embodiments, the substrate 2000 is an organic flexible substrate or a printed circuit board.

In some embodiments, a plurality of conductive elements 4000 are respectively formed on the substrate 2000. As shown in FIG. 14, for example, the conductive elements 4000 are physically connected to the contact pads 2020. In other words, the conductive elements 4000 are electrically connected to the substrate 2000 through the contact pads

2020. Through the contact pads 2010 and the contact pads 2020, some of the conductive elements 4000 are electrically connected to the package 100. In some embodiments, the conductive elements 4000 are, for example, solder balls or BGA balls. In certain embodiments, the stacked structure depicted in FIG. 14 may be formed by chip on wafer on substrate (CoWoS) packaging processes.

Referring to FIG. 15, in some embodiments, a heat dissipation lid 5000 with a thermal interface material 6000 coated on an inner surface S2 thereof is provided, and is bonded to the substrate 2000 to form the package PS2. The heat dissipation lid 5000 may have a high thermal conductivity, for example, between about 200 watts per meter kelvin (W/m·K) to about 400 W/m·K or more, and may be formed using a metal, a metal alloy, and the like. The heat dissipation lid 5000 is attached to the substrate 2000, in some embodiments, by using lock screws, adhesives (e.g. a silver paste) or the like, so that the package 100 and the circuit element 200 are arranged within an inner cavity of the heat dissipation lid 5000. As shown in FIG. 15, the package 100 and the circuit element 200 are located inside the inner cavity enclosed by the heat dissipation lid 5000 and the substrate 2000.

In some embodiments, as shown in FIG. 15, during bonding the heat dissipation lid 5000 to the substrate 2000, the conductive patterns 190 are inserted into the thermal interface material 6000, thereby the thermal interface material 6000 at least fills up the gap between the heat dissipation lid 5000 and the heat dissipating element HDE (including the conductive patterns 180 and the metallization layer 190) of the package 100. Owing to such configuration, the package 100 and the heat dissipation lid 5000 are stably adhered to each other, and the mechanical strength of the package PS2 is ensured. In some embodiment, the thermal interface material 6000 may include any suitable thermally conductive material, for example, a polymer having a good thermal conductivity, which may be between about 3 W/m·K to about 10 W/m·K or more. In some embodiments, the thermal interface material 6000 may include an indium sheet, a graphite sheet, or the like.

In some embodiments, as shown in FIG. 15, the conductive patterns 180 of the heat dissipating element HDE (of the package 100) penetrate through the thermal interface material 6000 to physically contact the inner surface S2 of the heat dissipation lid 5000, where the heat dissipating element HDE, the heat dissipation lid 5000, and the thermal interface material 6000 are thermally coupled. That is, the heat dissipating element HDE, the heat dissipation lid 5000, and the thermal interface material 6000 together constitutes a thermal path of heat dissipation for the package PS2. Owing to the heat dissipating element HDE, the thermal performances in the X and/or Y directions and the thermal performance in the Z direction are, respectively, improved by 15 times and 1.5-3.0 times; such that, the reliability of the package PS2 is further enhanced. In addition to dissipating heat for the package PS2, the heat dissipation lid 5000 may further provide physical protection to the package 100.

In accordance with some embodiments, a package structure includes a semiconductor die, a redistribution circuit structure, and a metallization element. The semiconductor die has an active side and an opposite side opposite to the active side. The redistribution circuit structure is disposed on the active side and is electrically coupled to the semiconductor die. The metallization element has a plate portion and a branch portion connecting to the plate portion, wherein the metallization element is electrically isolated to the semiconductor die, and the plate portion of the metallization element is in contact with the opposite side.

In accordance with some embodiments, a package structure includes an insulating encapsulation, a semiconductor die, and a metal film having a plurality of vias distributed thereon. The semiconductor die is embedded in the insulating encapsulation, wherein a first side of the semiconductor die is free of the insulating encapsulation. The metal film physically contacts the first side of the semiconductor die, wherein the metal film is sandwiched between the semiconductor die and the plurality of vias, and the plurality of the vias are thermally coupled to the semiconductor die through the metal film.

In accordance with some embodiments, a method of manufacturing a package structure include the following steps, providing a semiconductor die; encapsulating the semiconductor die in an insulating encapsulation; forming a redistribution circuit structure over a first side of the semiconductor die; removing a portion of the insulating encapsulation to expose a second side of the semiconductor die, wherein the second side is opposite to the first side; forming a metallization film directly on the second side of the semiconductor die exposed by the insulating encapsulation to physically contact the second side of the semiconductor die; and forming a plurality of vias on the metallization film, wherein the plurality of vias distributed over the metallization film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die, having an active side and an opposite side opposite to the active side;
   a redistribution circuit structure, disposed on the active side and electrically coupled to the semiconductor die;
   a metallization element, having a plate portion and a branch portion connecting to the plate portion, wherein the metallization element is electrically isolated to the semiconductor die, and the plate portion of the metallization element is in contact with the opposite side;
   a lid, located over the metallization element, wherein the branch portion of the metallization element is located between the lid and the plate portion of the metallization element; and
   a thermal interface material, coated on an inner surface of the lid and located between the lid and the plate portion of the metallization element, wherein the thermal interface material is penetrated by the branch portion of the metallization element, and a thermal conductivity of the thermal interface material is different from a thermal conductivity of the lid and the metallization element.

2. The package structure of claim 1, wherein the plate portion of the metallization element is in physical contact with the opposite side of the semiconductor die.

3. The package structure of claim 1, wherein the plate portion of the metallization element is sandwiched between the semiconductor die and the branch portion.

4. The package structure of claim 1, wherein the metallization element is thermally coupled to the semiconductor die.

5. The package structure of claim 1, further comprising:
an insulating encapsulation, laterally encapsulating the semiconductor die and sandwiched between the redistribution circuit structure and the metallization element; and
conductive terminals, disposed on and electrically connected to the redistribution circuit structure, wherein the redistribution circuit structure is sandwiched between the conductive terminals and the insulating encapsulation.

6. The package structure of claim 5, wherein the plate portion of the metallization element further extends onto a surface of the insulating encapsulation, and the opposite side of the semiconductor die and the surface of the insulating encapsulation are coplanar to each other.

7. The package structure of claim 5, wherein an orthogonal projection of the plate portion fully overlaps with an orthogonal projection of the insulating encapsulation and the semiconductor die.

8. The package structure of claim 1, wherein the branch portion of the metallization element comprises a plurality of conductive pins distributed over the plate portion.

9. The package structure of claim 1, further comprising:
a circuit substrate, bonded on and electrically connected to the semiconductor die,
wherein the lid is bonded on the circuit substrate, and the semiconductor die is located inside an accommodated space enclosed by the circuit substrate and the lid,
wherein the branch portion is in contact with the inner surface of the lid, and the semiconductor die is thermally coupled to the lid through the metallization element and the thermal interface material.

10. The package structure of claim 1, further comprising:
an interposer having a plurality of through vias penetrating therethrough, wherein the semiconductor die is mounted on and electrically connected to the interposer; and
a circuit substrate, bonded on and electrically connected to the interposer, wherein the interposer is located between the semiconductor die and the circuit substrate,
wherein the lid is bonded on the circuit substrate, and the semiconductor die and the interposer are located inside an accommodated space enclosed by the circuit substrate and the lid,
wherein the branch portion is in contact with the inner surface of the lid, and the semiconductor die is thermally coupled to the lid through the metallization element and the thermal interface material.

11. A package structure, comprising:
an insulating encapsulation;
a semiconductor die, embedded in the insulating encapsulation, wherein a first side of the semiconductor die is free of the insulating encapsulation;
a metal film having a plurality of vias distributed thereon, physically contacting the first side of the semiconductor die, wherein the metal film is sandwiched between the semiconductor die and the plurality of vias, and the plurality of the vias are thermally coupled to the semiconductor die through the metal film;
a lid, located over the metal film, wherein the plurality of vias is located between the lid and the metal film; and
a thermal interface material, coated on a flat surface of the lid and located between the lid and the metal film, wherein the thermal interface material is penetrated by the plurality of vias, and a thermal conductivity of the thermal interface material is different from a thermal conductivity of the lid.

12. The package structure of claim 11, wherein the metal film further physically contacts to a second side of the insulating encapsulation coplanar to the first side of the semiconductor die, and the metal film is sandwiched between the insulating encapsulation and the plurality of vias.

13. The package structure of claim 11, wherein an orthogonal projection of the metal film fully overlaps with an orthogonal projection of the insulating encapsulation and the semiconductor die.

14. The package structure of claim 11, wherein a ratio of an orthogonal projection of the plurality of vias to an orthogonal projection of the metal film approximately ranges from 0.30 to 0.80.

15. The package structure of claim 11, further comprising:
a redistribution circuit structure, disposed on and electrically connected to the semiconductor die, wherein the semiconductor die is sandwiched between the redistribution circuit structure and the metal film; and
a circuit substrate, bonded on and electrically connected to the redistribution circuit structure, the redistribution circuit structure is sandwiched between the circuit substrate and the semiconductor die,
wherein the lid is bonded on the circuit substrate, and the semiconductor die and the redistribution circuit structure are located inside an accommodated space enclosed by the circuit substrate and the lid,
wherein the plurality of vias is in contact with the flat surface of the lid, and the semiconductor die is thermally coupled to the lid through the metal film and the thermal interface material.

16. The package structure of claim 11, further comprising:
a redistribution circuit structure, disposed on and electrically connected to the semiconductor die, wherein the semiconductor die is sandwiched between the redistribution circuit structure and the metal film;
an interposer having a plurality of through vias penetrating therethrough, bonded on and electrically connected to the redistribution circuit structure; and
a circuit substrate, bonded on and electrically connected to the interposer, wherein the interposer is located between the redistribution circuit structure and the circuit substrate,
wherein the lid is bonded on the circuit substrate, and the semiconductor die, the redistribution circuit structure and the interposer are located inside an accommodated space enclosed by the circuit substrate and the lid,
wherein the plurality of vias is in contact with the flat surface of the lid, and the semiconductor die is thermally coupled to the lid through the metal film and the thermal interface material.

* * * * *